(12) United States Patent
Tung et al.

(10) Patent No.: US 12,513,891 B2
(45) Date of Patent: Dec. 30, 2025

(54) SEMICONDUCTOR DEVICE AND METHOD OF FABRICATING THE SAME

(71) Applicant: Fujian Jinhua Integrated Circuit Co., Ltd., Quanzhou (CN)

(72) Inventors: Yu-Cheng Tung, Quanzhou (CN); Janbo Zhang, Quanzhou (CN)

(73) Assignee: Fujian Jinhua Integrated Circuit Co., Ltd., Quanzhou (CN)

( * ) Notice: Subject to any disclaimer, the term of this patent is extended or adjusted under 35 U.S.C. 154(b) by 465 days.

(21) Appl. No.: 17/955,497

(22) Filed: Sep. 28, 2022

(65) Prior Publication Data

US 2023/0403843 A1 Dec. 14, 2023

(30) Foreign Application Priority Data

Jun. 10, 2022 (CN) .......................... 202210657973.7
Jun. 10, 2022 (CN) .......................... 202221456133.6

(51) Int. Cl.
*H10B 12/00* (2023.01)

(52) U.S. Cl.
CPC ......... *H10B 12/315* (2023.02); *H10B 12/033* (2023.02); *H10B 12/34* (2023.02)

(58) Field of Classification Search
CPC .................................................. H10B 12/033
See application file for complete search history.

(56) References Cited

U.S. PATENT DOCUMENTS

| 7,227,215 B2 | 6/2007 | Park |
| 9,159,729 B2 | 10/2015 | Kim |
| 9,287,270 B2 | 3/2016 | Oh |
| 9,553,141 B2 | 1/2017 | Yang |
| 9,853,032 B2 | 12/2017 | Seo |
| 10,355,002 B2 | 7/2019 | Sills |
| 10,483,265 B2 | 11/2019 | Lee |
| 10,714,565 B2 | 7/2020 | Nam |
| 10,943,908 B2 | 3/2021 | Bae et al. |
| 10,998,318 B2 | 5/2021 | Choo |
| 11,626,405 B2 | 4/2023 | Kim |

(Continued)

FOREIGN PATENT DOCUMENTS

| CN | 108550569 A | 9/2018 |
| CN | 107799523 B | 9/2021 |

OTHER PUBLICATIONS

Wu, the specification, including the claims, and drawings in the U.S. Appl. No. 18/122,096 , Filing Date: Mar. 15, 2023.

*Primary Examiner* — Zandra V Smith
*Assistant Examiner* — Molly K Reida
(74) *Attorney, Agent, or Firm* — Winston Hsu (57) ABSTRACT

The present disclosure provides a semiconductor device and a fabricating method thereof, including a substrate, a supporting structure and a capacitor structure. The supporting structure is disposed on the substrate, and the supporting structure includes a first supporting layer and a second supporting layer. The capacitor structure is disposed on the substrate and includes a plurality of bottom electrode layers. Each of the bottom electrode layers includes two portions extended upwardly, and one of the two portions has a first thickness between the substrate and the first supporting layer, and a second thickness between the first supporting layer and the second supporting layer, and the first thickness is greater than the second thickness.

10 Claims, 11 Drawing Sheets

(56) References Cited

U.S. PATENT DOCUMENTS

| | | |
|---|---|---|
| 2012/0064689 A1 | 3/2012 | Hirota |
| 2012/0187533 A1 | 7/2012 | Goodner |
| 2015/0294971 A1* | 10/2015 | Sapra ................ H01L 21/02052 |
| | | 257/532 |
| 2016/0013191 A1 | 1/2016 | Sapra |
| 2018/0166447 A1 | 6/2018 | Pak |
| 2019/0206983 A1 | 7/2019 | Nam |
| 2020/0006345 A1 | 1/2020 | Choo et al. |
| 2022/0189960 A1* | 6/2022 | Kaneko ................ H10B 12/31 |
| 2022/0238532 A1* | 7/2022 | Shreeram ............... H10B 12/31 |

* cited by examiner

SEMICONDUCTOR DEVICE AND METHOD OF FABRICATING THE SAME

BACKGROUND OF THE INVENTION

1. Field of the Invention

The present invention relates to a semiconductor device and the method for fabricating the same, in particular to a semiconductor memory device and a method for fabricating the same.

2. Description of the Prior Art

With the trend of miniaturization of various electronic products, the design of semiconductor memory devices must meet the requirements of high integration and high density. For a dynamic random access memory (DRAM) having recessed gate structures, because the carrier channel of which is relatively long in the same semiconductor substrate compared with that of the DRAM without recessed gate structures, the leakage current from the capacitor structure in the DRAM can be reduced. Therefore, the DRAM having recessed gate structures has gradually replaced DRAM having planar gate structures under the current mainstream development trend.

Generally, the DRAM having recessed gate structure is constructed by a large number of memory cells which are arranged to form an array area, and each of the memory cells can be used to store information. Each memory cell may include a transistor element and a capacitor element connected in series, which is configured to receive voltage information from word lines (WL) and bit lines (BL). In order to fulfill the requirements of advanced products, the density of memory cells in the array area must be further increased, which increases the difficulty and complexity of related fabricating processes and designs. Therefore, the present technology needs further improvement to effectively improve the efficiency and reliability of related memory devices.

SUMMARY OF THE INVENTION

One of the objectives of the present disclosure provides a semiconductor device, where the bottom electrode layers of the storage node has a uniform thickness, and a thin-top and thick-bottom structure, so as to effectively prevent from the structural or functional defect caused by sealing bottom electrode layers and/or capacitor dielectric layer. Also, the uniformed thickness of the bottom electrode layer may further improve the tip effect, and prevent from the excessive discharge and unstable performance happened on the storage nodes. Thus, the semiconductor device may therefore improve the structural reliability of the storage node, and further promote the functions and the performance thereof.

One of the objectives of the present disclosure provides a method of fabricating a semiconductor device, in which the upper-half of the bottom electrode layer is thinned to enlarge the storage node openings. Then, the storage node openings will not be sealed during depositing the bottom electrode layer and/or the capacitor dielectric layer, so as to effectively prevent from the structural or functional defect caused thereby. In this way, although the density of the memory cells has continuously increased, the storage nodes formed accordingly in the present disclosure may still gain structural reliability and better performance.

To achieve the purpose described above, one embodiment of the present disclosure provides a semiconductor device including a substrate, a supporting structure and a capacitor structure. The supporting structure is disposed on the substrate and includes a first supporting layer and a second supporting layer from bottom to top. The capacitor structure is disposed on the substrate and includes a plurality of bottom electrode layers. Each of the bottom electrode layers includes two portions extended upwardly, and one of the two portions has a first thickness between the substrate and the first supporting layer, and a second thickness between the first supporting layer and the second supporting layer, and the first thickness is greater than the second thickness.

To achieve the purpose described above, one embodiment of the present disclosure provides a method of fabricating a semiconductor memory device, including the following step. Firstly, a substrate is provided. Next, a supporting structure is formed and includes a first supporting layer and a second supporting layer from bottom to top. Then, a capacitor structure is formed on the substrate, with the capacitor structure including a plurality of bottom electrode layers. Each of the bottom electrode layers includes two portions extended upwardly, and one of the two portions has a first thickness between the substrate and the first supporting layer, and a second thickness between the first supporting layer and the second supporting layer, and the first thickness is greater than the second thickness.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 8 are schematic diagrams illustrating a fabricating method of a semiconductor device according to a first embodiment in the present disclosure, wherein:

FIG. 9 to FIG. 10 are schematic diagrams illustrating a fabricating method of a semiconductor device according to a second embodiment in the present disclosure, wherein:

DETAILED DESCRIPTION

To provide a better understanding of the presented disclosure, preferred embodiments will be described in detail. The preferred embodiments of the present disclosure are illustrated in the accompanying drawings with numbered elements. In addition, the technical features in different embodiments described in the following may be replaced, recombined, or mixed with one another to constitute another embodiment without departing from the spirit of the present disclosure.

Figure 1:
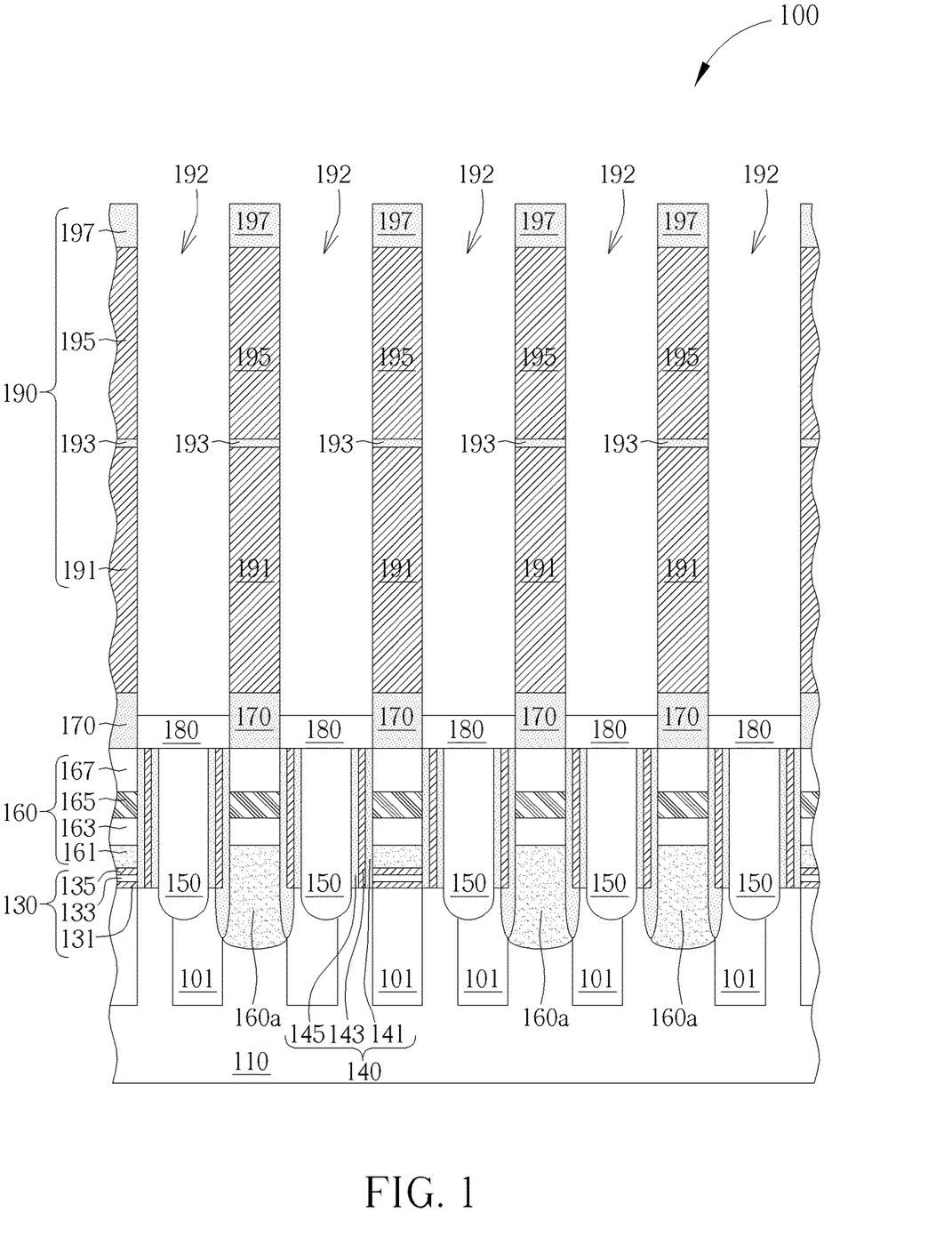
FIG. 1 shows a schematic cross-sectional view of a semiconductor device after forming a supporting structure.

Please refer to FIG. 1 to FIG. 8, which illustrate schematic diagrams of a fabricating method of a semiconductor device 100 according to the first embodiment in the present disclosure. Firstly, as shown in FIG. 1, a substrate 110 is provided, such as a silicon substrate, a silicon-containing substrate (for example including a material like SiC, SiGe), or a silicon-on-insulator (SOI) substrate, and at least one isolating region 101 such as a shallow trench isolation (STI) is formed in the substrate 110, to define a plurality of active areas (AAs, not shown in the drawings) thereby. In one embodiment, the formation of the isolating region 101 is accomplished by carrying out an etching process to form a plurality of trenches (not shown in the drawings) in the substrate 100, and an isolating material (for example silicon oxide or silicon oxynitride) is filled in the trenches, but not limited thereto.

Also, a plurality of buried gate structures (not shown in the drawings) is formed in the substrate 110, with each of the buried gate structure being parallel extended along a direction (for example the x-direction, not shown in the drawings) to intersect the active areas, and the buried gate structures may therefore serve as buried word lines (BWL, not shown in the drawings) of the semiconductor device 100. Then, a plurality of bit lines 160 and a plurality of plugs 150 are formed on the substrate 100, with each of the bit lines 160 being extended along another direction (for example the y-direction, not shown in the drawings) which is perpendicular to the direction, to alternately arrange with the plugs 150. It is noted that although the entire extending directions of the active areas, the buried gates and the bit lines 160 are not precisely illustrated in the drawings of the present embodiment, people in the art should fully realizes the bit lines 160 are perpendicular to the buried gates, to intersect the active areas and the buried gates as shown from a top view.

Precisely speaking, each of the bit lines 160 is separately formed on the substrate 110 and includes a semiconductor layer 161 (for example including polysilicon), a barrier layer 163 (for example including titanium and/or titanium nitride), conductive layer 165 (for example including a low-resistant metal like tungsten, aluminum, or copper), and a capping layer 167 (for example including silicon oxide, silicon nitride, or silicon oxynitride, but not limited thereto. It is noted that all of the bit lines 160 are principally parallel with each other and formed on a dielectric layer 130 over the substrate 110, wherein the dielectric layer 130 preferably includes a composited structure for example having a silicon oxide layer 131—silicon nitride layer 133—silicon oxide layer 135 structure, but is not limited thereto. Moreover, each of the bit lines 160 are all extended across a plurality of active areas, with each of the bit lines 160 further extending into each of the active areas through a corresponding bit line contact (BLC) 160a under the bit lines 160. It is also noted that, the bit line contact 160a and the semiconductor layer 161 of the bit lines 160 are monolithic, and the bit line contact 160a may directly contact the substrate 110 underneath. On the other hand, each of the plugs 150 are all separately formed on the substrate 110, to further extend into each of the active area, so that, each of the plugs 150 may therefore serve as storage node contact (SNC) of the semiconductor device 100, to directly contact the substrate 110 underneath. In one embodiment, the plugs 150 for example include a low resistant metal material like aluminum (Al), titanium (Ti), copper (Cu), or tungsten (W), and each of the plugs 150 and each of the bit lines 160 are isolated from each other by the spacer structure 140. In one embodiment, the spacer structure 140 may optionally include a monolayer structure or a multilayer structure as shown in FIG. 1, and the multilayer structure for example includes a first spacer 141 (for example including silicon nitride), a second spacer (for example including silicon oxide), and a third spacer 145 (for example including silicon nitride), but is not limited thereto.

Please refer to FIG. 1, a plurality of connecting pads (SN pads) 180 is further formed in a dielectric layer 170 over the substrate 110, with each of the connecting pad 180 being disposed over the plugs 150 and the bit lines 160 to in alignment with each of the plugs 150. In one embodiment, the connecting pads 180 also include a low resistant metal material like aluminum, titanium, copper, or tungsten, preferably to a metal material which is different from that of the plugs 150, but not limited thereto. In another embodiment, the connecting pads 180 and the plugs 150 may be monolithic optionally, to include the same material thereby. Then, a capacitor structure 260 is formed on the connecting pads 180. In one embodiment, the formation of the capacitor structure 260 includes but not limited to the following steps. Firstly, a supporting layer structure 190 is formed on the dielectric layer 170 over the substrate 110, and the supporting layer structure 190 for example includes at least one oxide layer and at least one nitride layer alternately stacked on the dielectric layer 170. In the present embodiment, the supporting layer structure 190 for example includes a first supporting material layer 191 (for example including silicon oxide), a second supporting material layer 193 (for example including silicon nitride or silicon carbonitride), a third supporting material layer 195 (for example including silicon oxide), and a fourth supporting material layer 197 (for example including silicon nitride or silicon carbonitride), but is not limited thereto. Preferably, the oxide layer (for example including the first supporting material layer 191 and the third supporting material layer 195) may include a relative greater thickness, for example being about 5 times to 10 times greater than that of the nitride layer (such as the second supporting material layer 193 and the fourth supporting material layer 197), and the nitride layer disposed away from the substrate 110 may include a relative greater thickness than that of the nitride layer disposed closed to the substrate 110, as shown in FIG. 1, but not limited thereto. Through these arrangements, the entire thickness of the supporting layer structure 190 may achieve about 1600 angstroms to 2000 angstroms, but is not limited thereto. People in the art should fully understand that the practical number of the aforementioned oxide layer (for example the first supporting material 191 and the third supporting material layer 195) and the aforementioned nitride layer (for example the second supporting material layer 193 and the fourth supporting material layer 197) is not limited to be above mentioned number, and which may be further adjusted based on practical product requirements, for example being three layers, four layer or other number. After that, a plurality of openings 192 may be formed in the supporting layer structure 190, to penetrate through the fourth supporting material layer 197, the third supporting material layer 195, the second supporting material layer 193, and the first supporting material layer 191 to in alignment with the connecting pads 180 underneath. Then, the top surface of each of the connecting pads 180 may therefore be exposed from each opening 192, as shown in FIG. 1.

Figure 2:
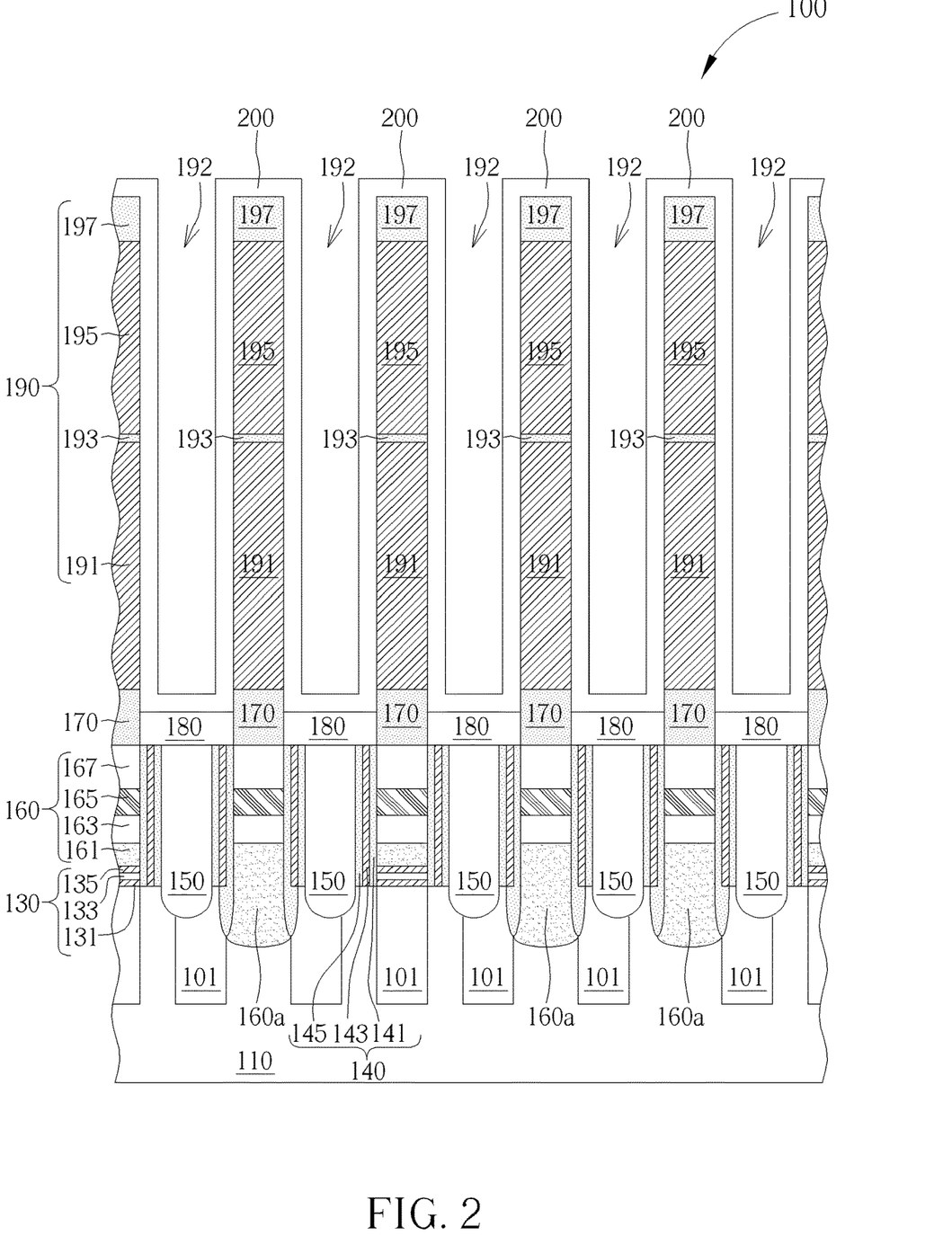
FIG. 2 shows a schematic cross-sectional view of a semiconductor device after forming an electrode material layer.

Next, as shown in FIG. 2, a deposition process is performed on the substrate 110 to form an electrode material layer 200. Precisely speaking, the electrode material layer 200 is for example conformally formed on the supporting layer structure 190, to cover on the top surface of the fourth supporting material layer 197, surfaces of each opening 192, and the top surface of the connecting pads 180, wherein the electrode material layer 200 for example includes a low resistant metal material like aluminum, titanium, copper or tungsten, but not limited thereto.

Figure 3:
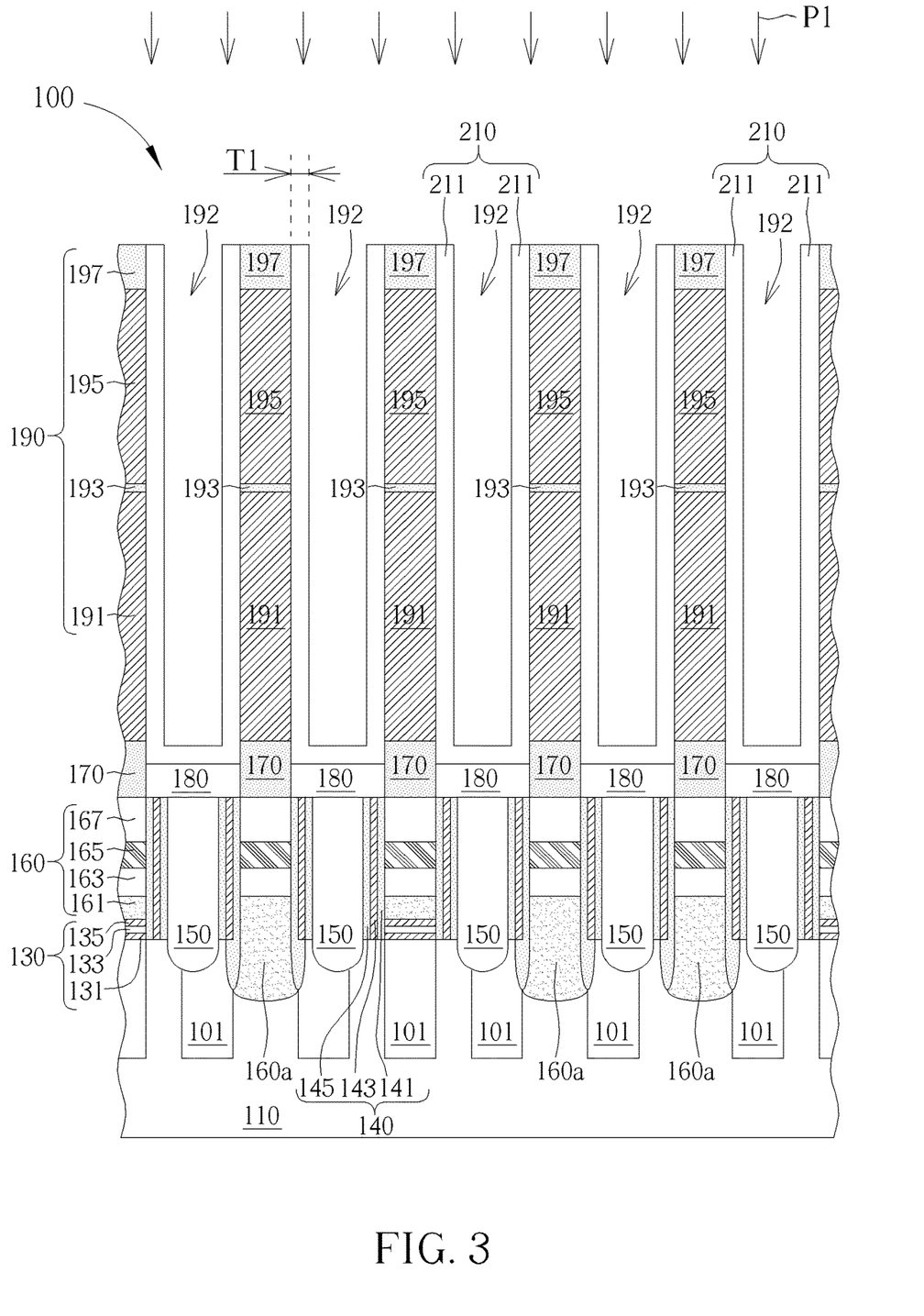
FIG. 3 shows a schematic cross-sectional view of a semiconductor device after performing a first etching process.

Then, as shown in FIG. 3, a first etching process P1 such a dry etching is performed, to remove the electrode material layer covered on the top surface of fourth supporting material layer 197, to form a plurality of initial bottom electrode layers 210, with each of the bottom electrode layers 210 being formed within each opening 192, covering the top surface of the connecting pads 180 and the surfaces of the openings 192 in a uniform manner, to obtain a uniform thickness T1. Moreover, each of the initial bottom electrode layers 210 covers both of the two opposite sidewalls of each opening 192, so as to include two portions 211 with the same height in the direction which is perpendicular to the substrate 110. Accordingly, each of the initial bottom electrode layers 210 may therefore include a left-right symmetrical structure, such as a U-shaped structure as shown in FIG. 3, but not limited thereto.

Figure 4:
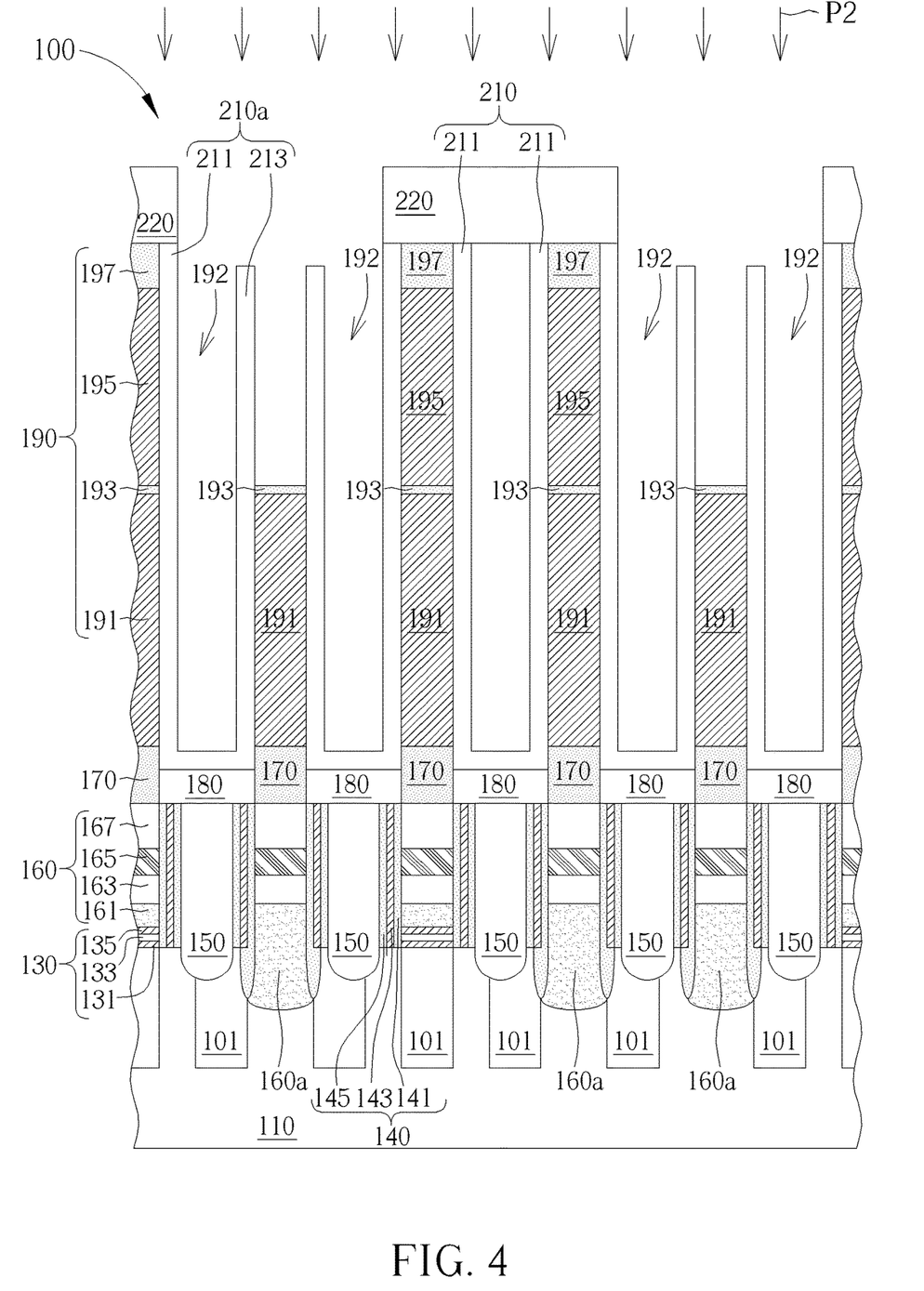
FIG. 4 shows a schematic cross-sectional view of a semiconductor device after performing a second etching process.

As shown in FIG. 4, a plurality of mask patterns 220 is then formed on the supporting layer structure 190, to cover a part of the fourth supporting material layer 197 and a part of the openings 192, and a second etching process P2 such as a dry etching process is performed then through the mask patterns 220. Precisely speaking, each of the mask patterns 220 is formed over the supporting layer structure 190 in a manner to simultaneously cover any one of the openings 192 and the supporting layer structure 190 disposed at two opposite sides thereof, and to expose two adjacent openings 192 at the two opposite sides of the one of the openings 192, such that, the part of the fourth supporting material layer 197 and the part of opening openings 192 are covered by the mask patterns 220 thereby, to expose another part of the fourth supporting material layer 197 and another part of openings 192. In this way, while performing the second etching process P2 through the mask patterns 220, the part of the fourth supporting material layer 197 which is exposed from the mask patterns 220, the portions 211 at both sides thereof, and the third supporting material layer 195 disposed below the part of the fourth supporting material layer 197 may be removed, so that, the initial bottom electrodes 210a located in each opening 192 uncovered by the mask patterns 220 may therefore include a relative short portion 213 (with the height being lower than the top surface of the fourth supporting material layer 197), and the portion 211 with a relative long height, and the initial bottom electrode layer 210a may therefore present an asymmetric U-shaped structure. On the other hand, the initial bottom electrode layer 210 located in each opening 192 covered by the mask patterns 220 includes two relative long portions 211 with the same height, so as to present a symmetric U-shaped structure, as shown in FIG. 4. Then, the mask patterns 220 are completely removed.

Figure 5:
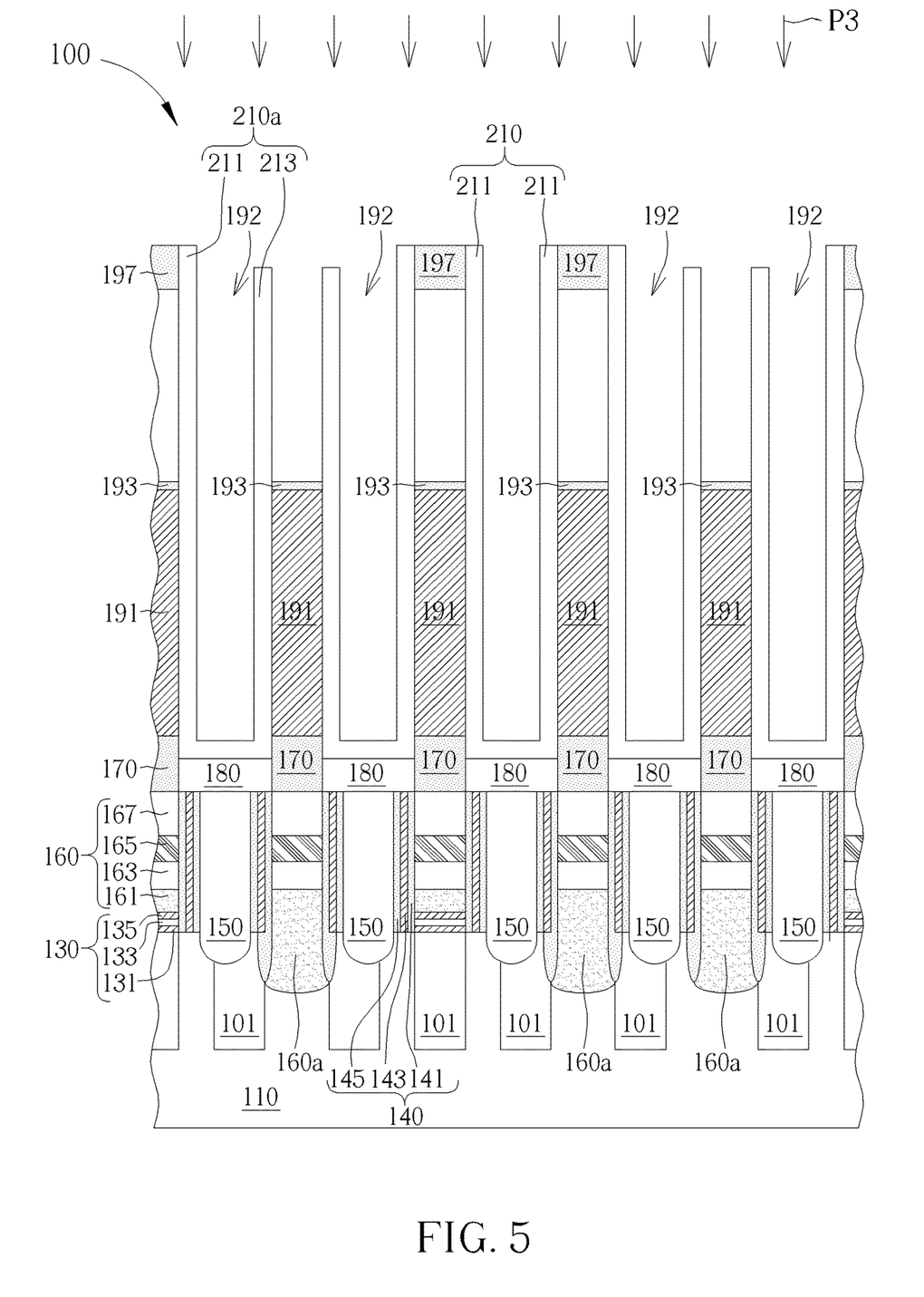
FIG. 5 shows a schematic cross-sectional view of a semiconductor device after performing a third etching process.

As shown in FIG. 5, a third etching process P3 such as an isotropic wet etching process is performed, to completely remove the third supporting material layer 195 of the supporting layer structure 190. Precisely speaking, the wet etching process is carried out by introducing an etchant such as tetramethylammonium hydroxide (TMAH), to remove the rest part of the third supporting material layer 195 via the space generated by removing the another part of the fourth supporting material layer 197 and the third supporting material layer 195 underneath, but not limited thereto. Accordingly, the portions 213 of a part of the initial bottom electrode layers 210a may therefore reveal two opposite sidewalls at the upper-half thereof, and the portions 211 of a part of the initial bottom electrode layers 210a may only partially reveal one of two opposite sidewall of at upper-half thereof because of being in connection with the fourth supporting material layers 197, as shown in FIG. 5. Furthermore, the portions 211 of another part of the initial bottom electrode layer 210 also partially reveals one of the two opposite sidewall at the upper-half thereof because of being in connection with the fourth supporting material layers 197. It is noted that, in the present embodiment, the two portions 211, 213 of each of the initial bottom electrode layers 210, 210a where is higher than the top surface of the second supporting material layer 193 or is between fourth supporting material layer 197 and the second supporting material layer 193 are defined as the upper-half, and the two portions 211, 213 of each of the initial bottom electrode layers 210, 210a where is lower than the top surface of the second supporting material layer 193, or is between the second supporting material layer 193 and the substrate 110 are defined as the lower-half, but is not limited thereto. Also, all of the portions 211 of each of the initial bottom electrode layers 210, 210a only reveal one sidewall at the lower-half thereof, with another sidewall at the lower-half thereof being covered by the second supporting material layer 193, and the first supporting material layer 191, as shown in FIG. 5.

Figure 6:
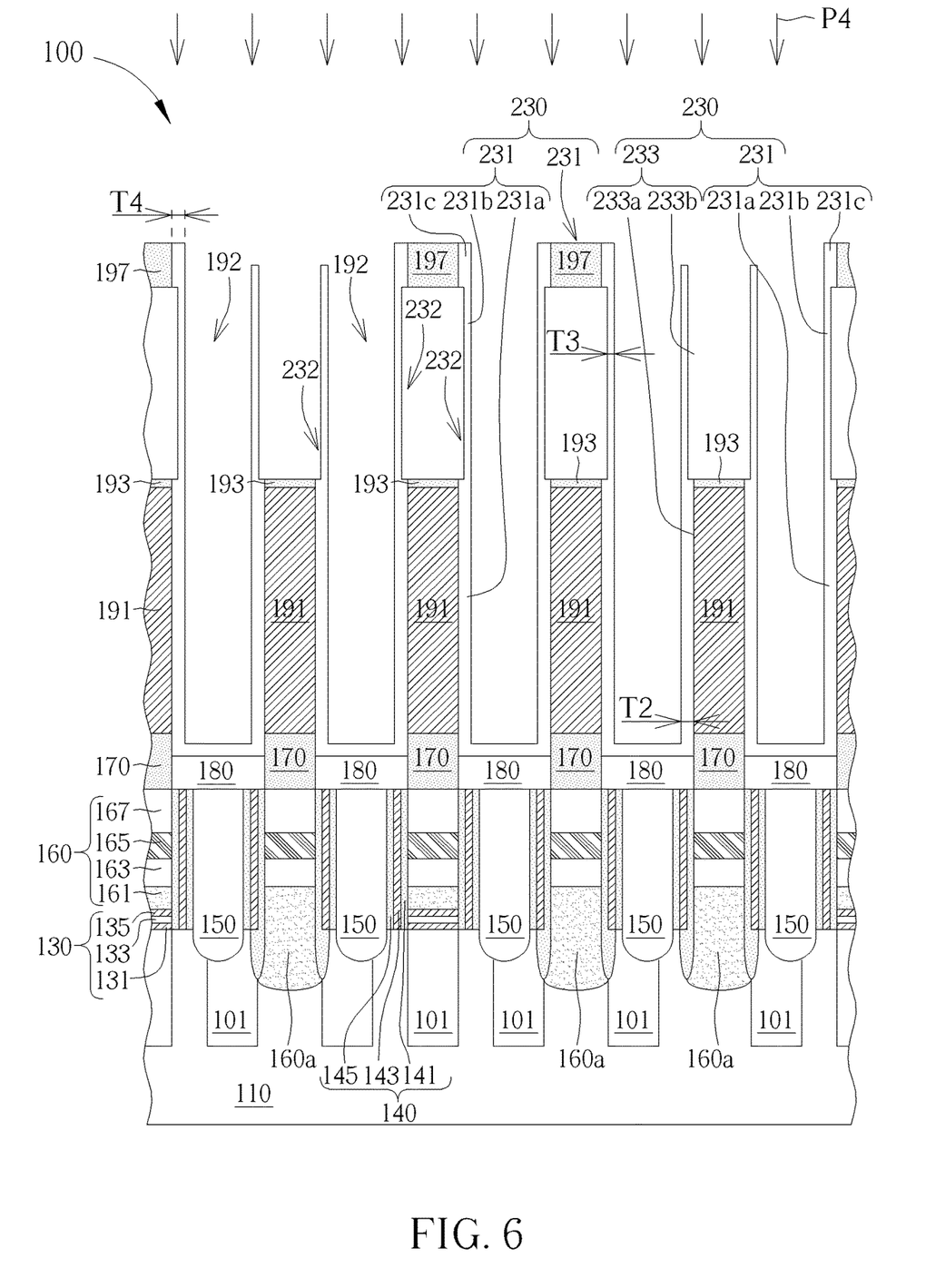
FIG. 6 shows a schematic cross-sectional view of a semiconductor device after performing a thinning process.

After removing the rest part of the third supporting material layer 195, a thinning process P4 such as an another isotropic wet etching process is next performed as shown in FIG. 6, to partially remove the initial bottom electrode layers 210, 210a via the exposed sidewalls of the portions 211, 213 thereof. In other words, the etchant of the another isotropic wet etching process partially etch the portions 211, 213 of each of the initial bottom electrode layers 210, 210a through the both revealed sidewalls at the upper-half thereof, and the revealed single sidewall of the lower-half thereof, and the initial bottom electrode layers 210, 210a covered on the connecting pads 180, to form thinned bottom electrode layers 230, 230a, as shown in FIG. 6. That is, portions 231, 233 of the thinned bottom electrode layers 230, 230a may therefore have different thicknesses due to whether the both sidewalls thereof are exposed to the etchant or not.

Precisely speaking, each of the bottom electrode layers 230a still include two portions 231, 233 with different heights, wherein the lower-half of the portion 231 and the portion 233 are thinned from the original thickness T1 to a first thickness T2 because only single sidewall is revealed to the etchant, thereby to form first segments 231a, 233a having a uniform thickness respectively, and the upper-half of the portion 231 and the portion 233 are further thinned from the original thickness T1 to a second thickness T3 because both sidewalls are revealed to the etchant, thereby to form second segments 231b, 233b also having a uniform thickness respectively. The second thickness T3 of the second fragments 231b, 233b is smaller than the first thickness T2 of the first fragments 231a, 233a. On the other hand, each of the bottom electrode layers 230 still include two portions 231 with the same height, wherein the lower-half of the portions 231 are also thinned from the original thickness T1 to a first thickness T2 because only the single sidewall is revealed to the etchant, thereby to form first segments 231a, 233a having a uniform thickness respectively, and the upper-half of the portions 231 are further thinned from the original thickness T1 to a second thickness T3 because both sidewalls are revealed to the etchant, thereby to form second segments 231b also having a uniform thickness respectively. It is noted that, due to the difference of the thinning degree between the upper-half and the lower-half of the portions 231, 233, the upper-half of the portions 231, 233 may respectively include a recess 232, which has a uniform thickness in the horizontal direction parallel to the surface of the substrate 110, as shown in FIG. 6. The bottom surface and the top surface of the recess 233 are aligned with the top surface of the second supporting material layer 193 and the bottom surface of the fourth supporting material layer 197, respectively. It is also noted that, as the upper-half of the portions 231 are partially connected to the fourth supporting material layer 197, it is shielded by the fourth supporting material layer 197, so that the upper-half of the portions 231 where are connected to the fourth supporting material layer 197 is also revealed to the etchant only through a single sidewall thereof, thereby forming third segments 231c having a third thickness T4 in a uniform manner. The third thickness T4 is the same as the first thickness T2, but is not limited thereto, and in another embodiment, the third thickness T4 may be optionally greater than the first thickness T2. In other words, each of the portions 231 includes the first segment 231a (having the first thickness T2 and extending from the top surface of the connecting pads 180 to the top surface of the second supporting material layer 193), the second segment 231b (having the second thickness T3 and extending from the top surface of the second supporting material layer 193 to the bottom surface of the fourth supporting material layer 197), and the third segment 231c (having the third thickness T4 and extending from the bottom surface of the fourth supporting material layer 197 to the top surface of the fourth supporting material layer 197) stacked from bottom to top, and each of the portions 233 includes the first segment 233a (having the first thickness T2 and extending from the top surface of the connecting pads 180 to the top surface of the second supporting material layer 193) and the second segment 233b (having the second thickness T3 and extending from the top surface of the second supporting material layer 193 to the bottom surface of the fourth supporting material layer 197) stacked from bottom to top. That is, the portions 231 include a relative longer height, with the recesses 232 being disposed between the third segment 231c and the first segment 231a, and the portions 233 include a relative shorter height, with the recesses 232 being disposed on the second segments 231, as shown in FIG. 6. Accordingly, each of the bottom electrode layers 230a has two portions 231, 233 with different heights and different thicknesses, to present in an asymmetric U-shaped structure as a whole, and each of the bottom electrode layers 230 has two portions 231 with the same height, to present in a symmetric U-shaped structure.

Figure 7:
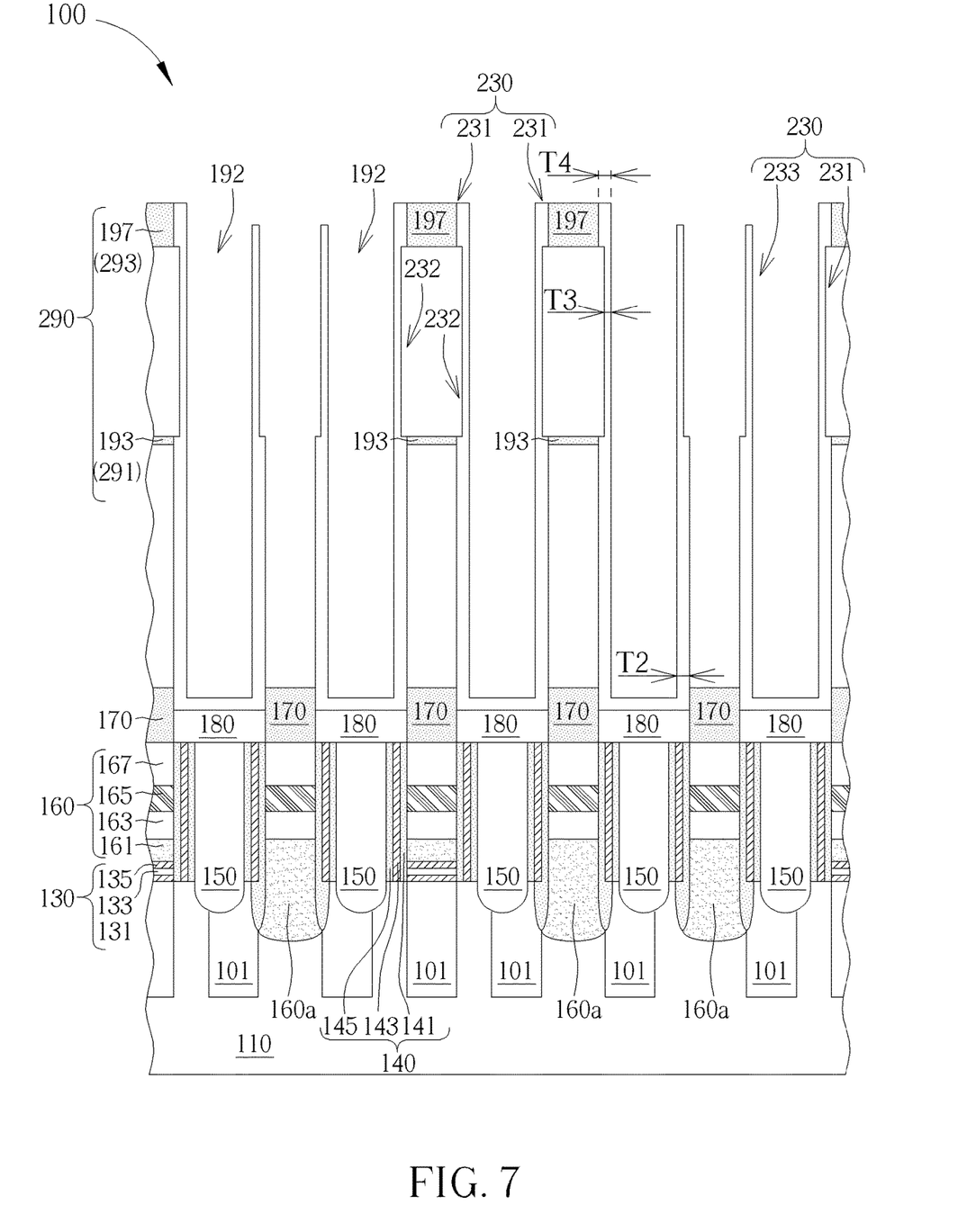
FIG. 7 shows a schematic cross-sectional view of a semiconductor device after completely removing a first supporting material layer.

Then, as shown in FIG. 7, at least two etching processes, such as including a dry etching process and an isotropic wet etching process, are performed sequentially, to firstly remove the second supporting material layer 193 and the first supporting material layer 191 under the another part of the fourth supporting material layer 197, followed by introducing tetramethylammonium hydroxide to remove the rest part of the first supporting material layer 191 via the space generated by removing the aforementioned second supporting material layer 193 and the first supporting material layer 191. Accordingly, the rest part of the second supporting material layer 193 and the fourth supporting layer 197 may respectively form a first supporting layer 291 and a second supporting layer 293 sequentially disposed from bottom to top, wherein the first supporting layer 291 and the second supporting layer 293 are at least disposed at a side of each of the bottom electrode layer 230, 230a, to together form a supporting structure 290. Preferably, the second supporting layer 293 which is disposed away from the substrate 110 may includes a greater thickness than that of the first supporting layer 291 disposed adjacent to the substrate 110, as shown in FIG. 7, but is not limited thereto.

Figure 8:
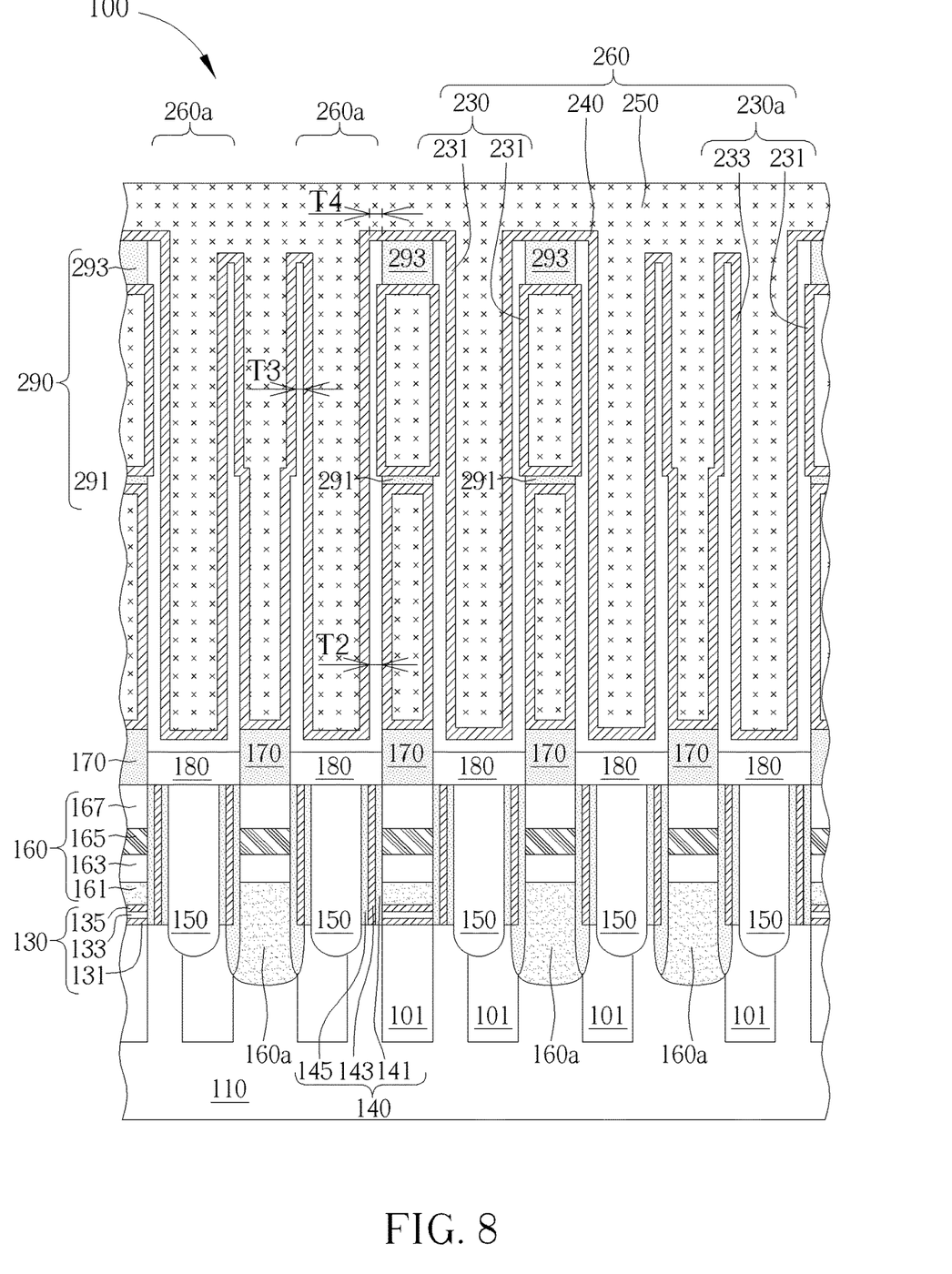
FIG. 8 shows a schematic cross-sectional view of a semiconductor device after forming a capacitor structure.

Following these, as shown in FIG. 8, a capacitor dielectric layer 240 and a top electrode layer 250 are sequentially formed on each of the bottom electrode layers 230, 230a, wherein, the capacitor dielectric layer 240 is conformally covered on the bottom electrode layers 230, 230a and the first supporting layer 291, and the top electrode layer 250 is disposed to fill up the rest space of each opening 192, and to further cover on the second supporting layer 293. It is noted that a part of the capacitor dielectric layer 240 and the top electrode layer 250 may further fill between the second supporting layer 293 and the first supporting layer 291, and between the first supporting layer 291 and the dielectric layer 170. In one embodiment, the capacitor dielectric layer 240 for example includes a high-k dielectric material, which is selective from a group consisted of hafnium oxide ($HfO_2$), hafnium silicon oxide ($HfSiO_4$), hafnium silicon oxynitride (HfSiON), zinc oxide ($ZrO_2$), titanium oxide ($TiO_2$) and zirconia-alumina-zirconia (ZAZ), and preferably includes zirconia-alumina-zirconia, but not limited thereto. The top electrode layer 250 for example includes a low resistant metal material like aluminum, titanium, copper, or tungsten, and preferably includes titanium, but not limited thereto.

Thus, the fabrication of the capacitor structure 260 is accomplished thereby. The capacitor structure 260 for example includes the bottom electrode layers 230, 230a, the capacitor dielectric layer 240, and the top electrode layers 250 stacked sequentially from bottom to top, thereby forming a plurality of vertically extended capacitors 260a to serve as the storage nodes (SNs) of the semiconductor device 100. The storage nodes are allowable to be electrically connected to the transistor (not shown in the drawings) of the semiconductor device 100 through the connecting pads 180 and the storage node contacts (namely the plugs 150), so that, the capacitor structure 260 may serve good contact relationship with the storage node contacts disposed on the substrate 110. In this way, the semiconductor device 100 of the present embodiment may form a dynamic random access memory (DRAM) device, which includes at least one transistor (not shown in the drawings) and at least one capacitor 260a, thereto serve as the smallest unit in the DRAM array for accepting signals from the bit lines (BLs) 160 and the buried word lines during the operation.

According to the fabricating method of the present embodiment, the etching process P2 (as shown in FIG. 4) is firstly performed on the semiconductor device 100, to firstly remove the fourth supporting material layer 197 disposed at specific location, the initial bottom electrode layers 210 at two sides of the specific supporting material layer 197, and the third supporting material layer 195 below the specific supporting material layer 197, and then, the thinning process P4 (as shown in FIG. 6) is performed on the semiconductor device 100, after completely removing the third supporting material layer 195, such that, all of the bottom electrode layers 230, 230a are thinned. It is noteworthy that, the lower-half of all the bottom electrode layers 230, 230a are only thinned from the single side to form the first segments 231a, 233a with the first thickness, while the upper-half of the bottom electrode layers 230, 230a are thinned from both sides to form the second segments 231b, 233b with the second thickness T3, so that the bottom electrode layers 230, 230a may present a thin-top and thick-bottom structure, thereby achieving the effect like enlarging the diameter of each opening 192 at top. Also, in the present embodiment, the portions 231 of the bottom electrode layers 230 includes the first segment 231a (having the first thickness T2 and extending from the connecting pads 180 to the first supporting layer 291) between the first supporting layer 291 and the substrate 110, the second segment 231b (having the second thickness T3 and extending from the first supporting layer 291 to the second supporting layer 293) between the second supporting layer 293 and the first supporting layer 291, and the third segment 231c (having the third thickness T4 and extending between the bottom surface and the top surface of the second supporting layer 293) disposed on sidewalls of the second supporting layer 293 stacked sequentially, and the portions 233 of the bottom electrode layers 230 includes the first segment 233a (having the first thickness T2) between the first supporting layer 291 and the substrate 110, the second segment 233b (having the second thickness T3) between the second supporting layer 293 and the first supporting layer 291 stacked sequentially. Accordingly, each of the bottom electrode layers 230a has two portions 231, 233 with different heights and different thicknesses, to present in an asymmetric U-shaped structure as a whole, and each of the bottom electrode layers 230 has two portions 231 with the same height, to present in a symmetric U-shaped structure. With these arrangements, although the density of the memory cells within the semiconductor device 100 is continuously increased to lead to excessively narrow aperture of each opening 192, the fabricating method of the present embodiment is sufficient to avoid the issues like merging the two portions 231, 233, or even sealing the openings 192 while depositing the bottom electrode layers 231, 233, as well as depositing the capacitor dielectric layer 240. Also, every portion of the thinned bottom electrode layers 230, 230a will all have uniform thickness, so as to avoid the tip effect, preventing from the excessive discharge and unstable performance happened on the storage nodes. Thus, the semiconductor device 100 according to the first preferable embodiment in the present disclosure may therefore improve the structural reliability of the storage node, and further promote the functions and the performance thereof.

People well known in the arts should easily realize the semiconductor memory device and the fabricating method thereof in the present disclosure is not limited to the aforementioned embodiment, and may further include other examples or variety. For example, in another embodiment, the first etching process P1 may be omitted, and the electrode material layer 200 covered on the top surface of the fourth supporting material layer 197 may be removed while performing the subsequent etching process such as the second etching process P2 as shown in FIG. 4 or the third etching process P3 as shown in FIG. 5. The following description will detail the different embodiments of the semiconductor device and fabricating method thereof in the present disclosure. To simplify the description, the following description will detail the dissimilarities among the different embodiments and the identical features will not be redundantly described. In order to compare the differences between the embodiments easily, the identical components in each of the following embodiments are marked with identical symbols.

Figure 9:
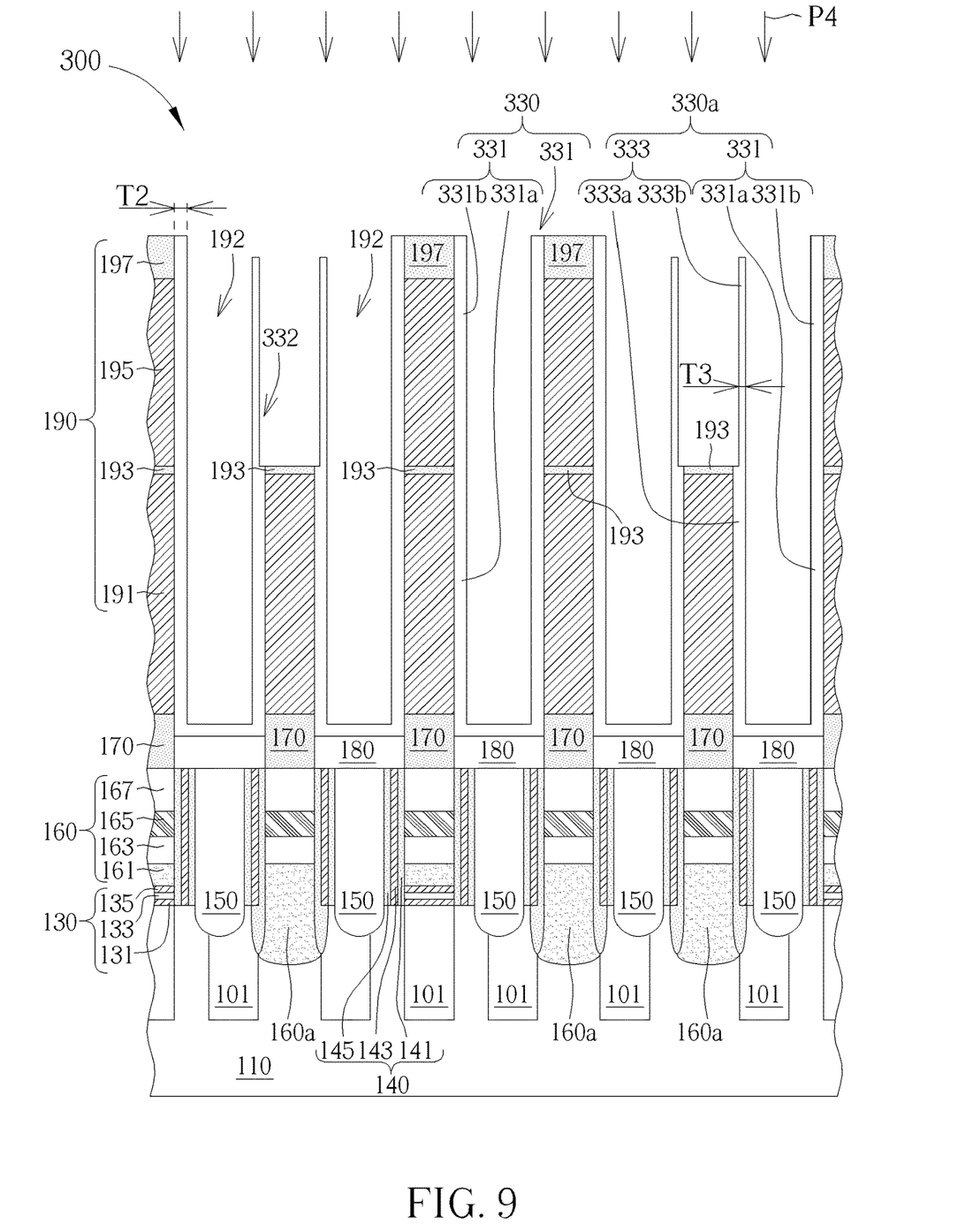
FIG. 9 shows a schematic cross-sectional view of a semiconductor device after performing a thinning process.
Figure 10:
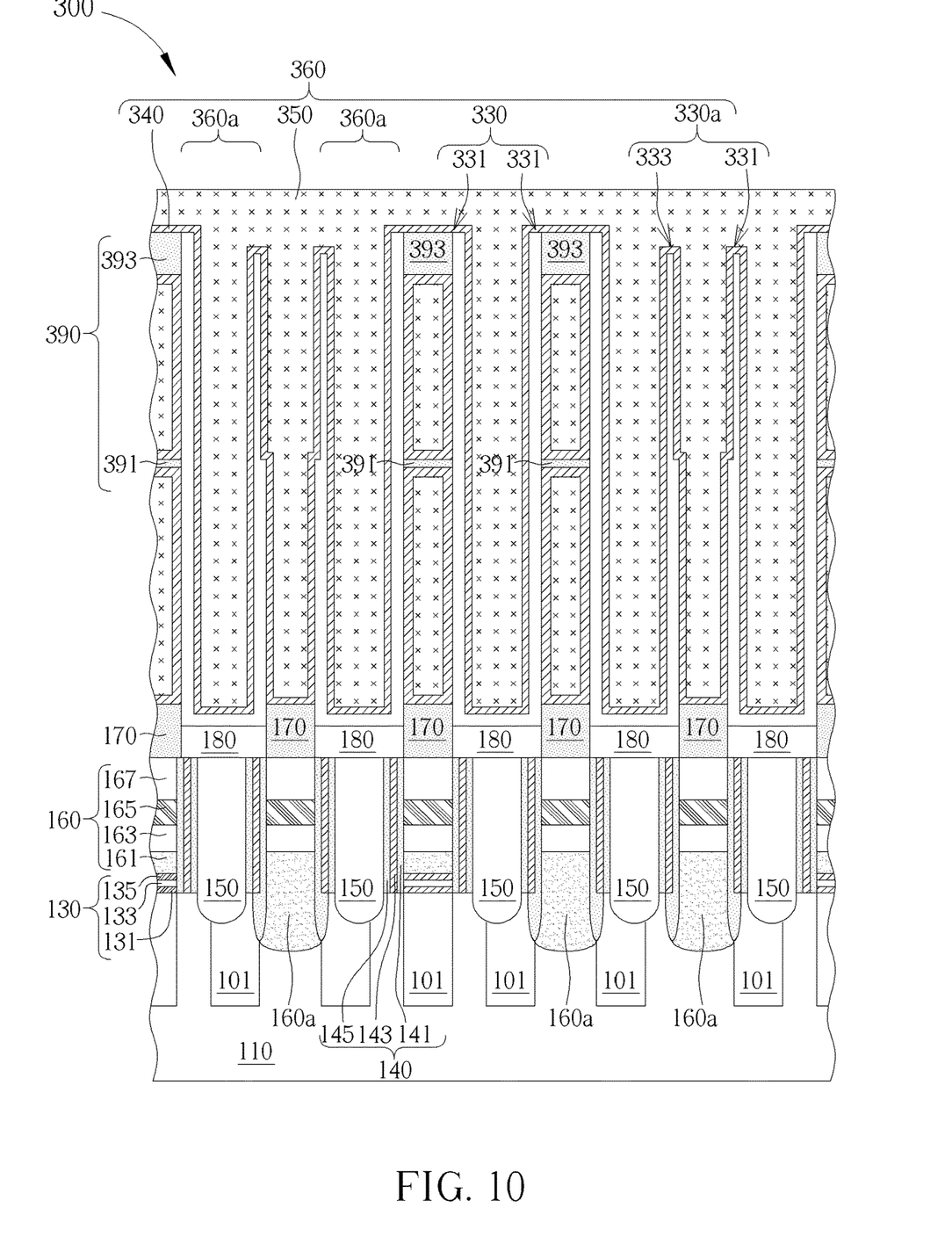
FIG. 10 shows a schematic cross-sectional view of a semiconductor device after forming a capacitor structure.

Please refer to FIG. 9 to FIG. 10, which illustrate schematic diagrams of a fabricating method of a semiconductor device 300 according to the second embodiment in the present disclosure. The forming processes at the front end of the semiconductor device 300 in the present embodiment are substantially the same as those of the semiconductor device 100 in the aforementioned first embodiment, as shown in FIG. 1 to FIG. 4, and all the similarities will not be redundantly described herein after. The difference between the present embodiment and the aforementioned first embodiment is in that after forming the semiconductor structure as shown in FIG. 4, with the another part of the fourth supporting material layer 197, the portions 211 disposed adjacent to the another part of the fourth supporting material layer 197, and the third supporting material layer 195 disposed below the another part of the fourth supporting material layer 197 being removed, and before removing the rest part of the third supporting material layer 195, to performed the thinning process P4.

Precisely speaking, as shown in FIG. 9, after performing the second etching process P2 and completely removing the mask patterns 220, the thinning process P4 is performed on the portions 211, 213 of the initial bottom electrode layers 210, 210a. It is noted that, after performing the second etching process P2, the portions 211, 213 of the initial bottom electrode layers 210, 210a only reveal a single sidewall at the lower-half thereof, with another sidewall being covered by the first supporting material layer 191, and the second supporting material layer 193. In other words, the portions 213 of the initial bottom electrode layer 210a reveal both sidewalls at the upper-half, and the portions 211 of the initial bottom electrode layer 210a also reveal a single sidewall at the upper-half thereof, with another sidewall being covered by the third supporting material layer 195 (please reference to FIG. 4 of the first embodiment). Accordingly, the thinning process P4 of the present embodiment such as an isotropic wet etching process is performed to partially etch the portions 213 of each of the initial bottom electrode layers 210a through the both revealed sidewalls at the upper-half thereof, the portions 211 of each of the initial bottom electrode layers 210 through the single revealed sidewall at the upper-half thereof, the portions 211, 213 of each of the initial bottom electrode layers 210, 210a through the single revealed sidewall at the lower-half thereof, and the initial bottom electrode layer 210, 210a covered on the connecting pads 180, to form a plurality of thinned bottom electrode layers 330, 330a, as shown in FIG. 9.

Further in view of FIG. 9, each of the bottom electrode layers 330a still includes two portions 331, 333 with different heights and thicknesses, to present in an asymmetric U-shaped structure as a whole, wherein first segments 331a, 333a of the portions 331, 333 are revealed to the etchant only through the single sidewall thereof, so as to be thinned from the original thickness T1 to the first thickness T2, and second segments 331b of the portions 331 are also revealed to the etchant only through the single sidewall thereof, so as to also obtain the first thickness T2 same as that of the first segments 331a, 333a. On the other hand, second segments 333b of the portions 333 are revealed to the etchant through both of the sidewalls, and which is further thinned to obtain the second thickness T3, and the second thickness T3 is smaller than the first thickness T2. Moreover, each of the bottom electrode layers 330 still include the two portions 331 with the same height, so as to present in a symmetric U-shaped structure, wherein the first segment 331*a* and the second segment 333*b* of the portions 331 are revealed to the etchant only through the single sidewall thereof, so as to be thinned from the original thickness T1 to the first thickness T2. In this way, the recess 232 of the aforementioned first embodiment may no longer be formed on the portions 331, so that the thickness of the portions 331 may be further uniform. On the other hand, the portions 333 still have recesses 332 formed on the second segment 333*b*, as shown in FIG. 9. Following these, at least two etching process including a dry etching process and an isotropic wet etching process are performed sequentially, to firstly remove the second supporting material layer 193 and the first supporting material layer 191 below the another part of the fourth supporting material layer 197, followed by introducing an etchant such as tetramethylammonium hydroxide, to further remove the rest part of the third supporting material layer 195 and the rest part of the first supporting material layer 191 through the spacer generated from removing the second supporting material layer 193 and the first supporting material layer 191 below the another part of the fourth supporting material layer 197, but not limited thereto.

Accordingly, the rest part of the second supporting material layer 193 and the rest part of the fourth supporting material layer respectively form a first supporting layer 391 and a second supporting layer 393 sequentially disposed from bottom to top, wherein the first supporting layer 391 and the second supporting layer 393 are at least disposed at a side of each of the bottom electrode layer 330, 330*a*, to together form a supporting structure 390 for supporting the capacitors 360. Preferably, the second supporting layer 393 which is disposed away from the substrate 110 may includes a greater thickness than that of the first supporting layer 391 disposed adjacent to the substrate 110, as shown in FIG. 10, but is not limited thereto.

After that, as further in view of FIG. 10, a capacitor dielectric layer 340 and a top electrode layer 350 are sequentially formed on each of the bottom electrode layers 330, 330*a*, wherein, the capacitor dielectric layer 340 is conformally covered on the bottom electrode layers 330, 330*a* and the first supporting layer 391, and the top electrode layer 350 is disposed to fill up the rest space of each opening 192, and to further cover on the second supporting layer 393. It is noted that a part of the capacitor dielectric layer 340 and the top electrode layer 350 may further fill between the second supporting layer 393 and the first supporting layer 391, and between the first supporting layer 391 and the dielectric layer 170. In one embodiment, the materials of the capacitor dielectric layer 340 and/or the top electrode layer 350 may be the same as those of the capacitor dielectric layer 240 and/or the top electrode layer 250, and will not be redundantly described hereinafter.

Thus, the fabrication of the capacitor structure 360 is accomplished thereby. The capacitor structure 360 for example includes the bottom electrode layers 330, 330*a*, the capacitor dielectric layer 340, and the top electrode layers 350 stacked sequentially from bottom to top, thereby forming a plurality of vertically extended capacitors 360*a* to serve as the storage nodes (SNs) of the semiconductor device 300. The storage nodes are allowable to be electrically connected to the transistor (not shown in the drawings) of the semiconductor device 300 through the connecting pads 180 and the storage node contacts (namely the plugs 150), so that, the capacitor structure 360 may serve good contact relationship with the storage node contacts disposed on the substrate 110. In this way, the semiconductor device 300 of the present embodiment may also form a dynamic random access memory device.

According to the fabricating method of the present embodiment, the thinning process P4 (as shown in FIG. 9) is performed right after the etching process P2 to thin out the bottom electrode layers 330, 330*a*. In the present embodiment, the lower-half of the bottom electrode layers 330, 330*a* are all thinned through the single sidewall thereof, to form the first segments 331*a*, 333*a* with the first thickness T2. Also, the portions 331 of the bottom electrode layers 330*a* are also thinned at the upper-half thereof through the single sidewall, to obtain the segment 331*b* with the first thickness T2, and the portions 333 of the bottom electrode layers 330*a* are thinned at the upper-half thereof from the both sidewalls, so as to obtain the second segments 333*b* with the second thickness T3. Thus, the portions 333 of the bottom electrode layers 330*a* may present a thin-top and thick-bottom structure, thereby achieving the effect like enlarging the diameter of each opening 192 at top, and the subsequent deposition process may be performed more efficiently, to gain more benefit while increasing the integrity. Furthermore, while the bottom electrode layers 330*a* presented in an asymmetric U-shaped structure as a whole, the diameter of each opening openings 192 within the semiconductor device 300 may be further enlarge accordingly. It is noted that, while performing the thinning process P4 of the present embodiment, the third supporting material layer 195 is partially remained on the segments 331*b* of the portions 331 for shielding, so that, both of the first segments 331*a* and the second segments 331*b* of the portions 331 are allowable to contact the etchant only through the single sidewall thereof, so as to obtain the first thickness T2 which is uniform as a whole without forming any recess 232 as shown in the aforementioned first embodiment. With these arrangements, the semiconductor device 300 of the present embodiment also enables to effectively prevent from the structural defect caused by merging the two portions 331, 333, or even sealing the openings 192 while depositing the bottom electrode layers 331, 333, while the density of the memory cells within the semiconductor device 300 is continuously increased. Meanwhile, only the bottom electrode layers 330*a* have an asymmetric U-shaped structure, which may further avoid affecting the overall capacitance and the structural stability. Then, the semiconductor device 300 according to the second embodiment in the present disclosure may therefore improve the structural reliability of the storage node, and further promote the functions and the performance thereof.

Figure 11:
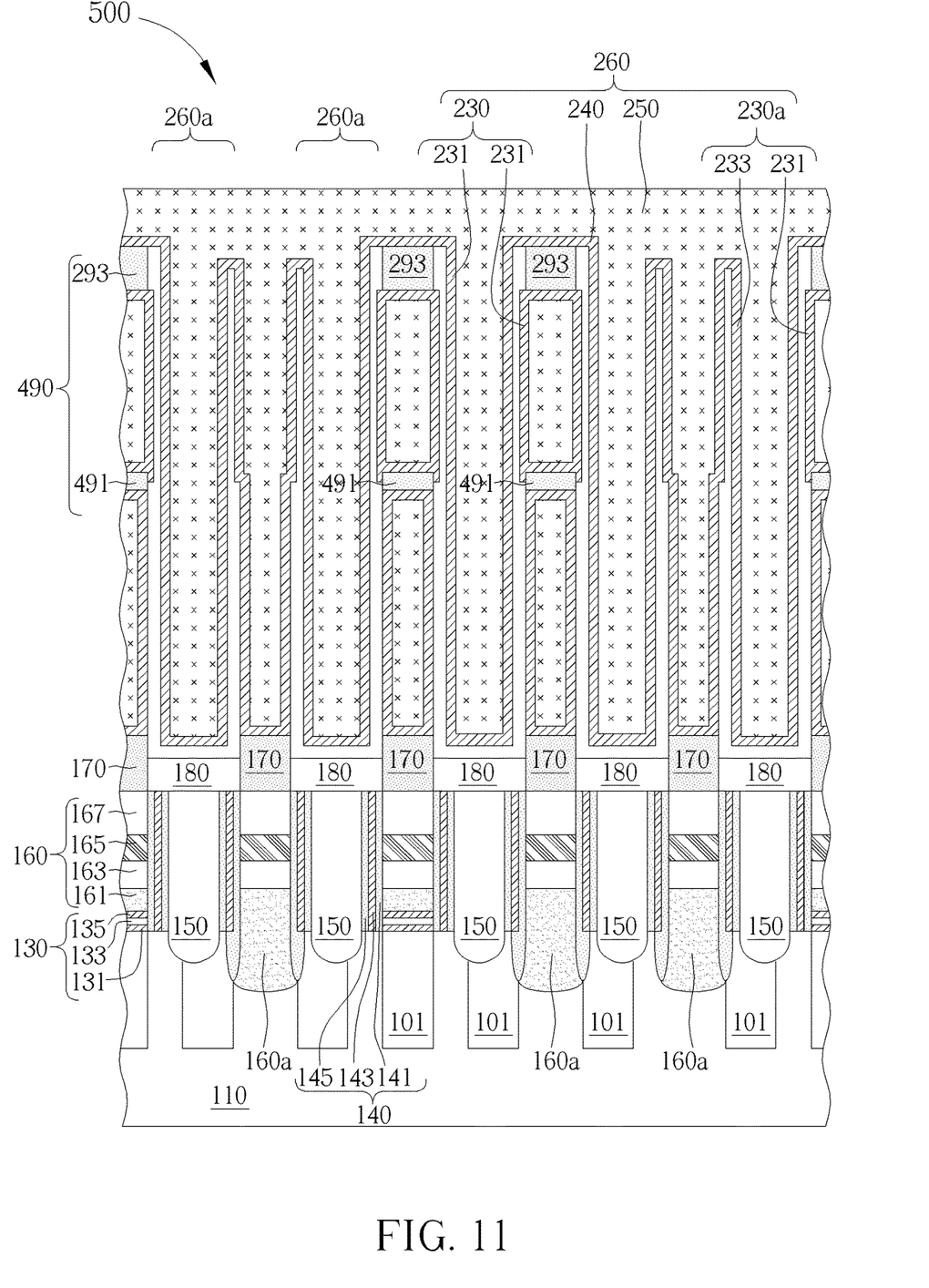
FIG. 11 is a schematic diagram illustrating a fabricating method of a semiconductor device according to a third embodiment in the present disclosure.

Please refer to FIG. 11, which illustrate schematic diagram of a semiconductor device 500 according to the third embodiment in the present disclosure. The structure of the semiconductor device 500 in the present embodiment are substantially the same as that of the semiconductor device 100 in the aforementioned first embodiment, as shown in FIG. 8, and all the similarities will not be redundantly described herein after. The difference between the present embodiment and the aforementioned first embodiment is in that the thickness of the first supporting layer 491 disposed closed to the substrate 110 is no smaller than the thickness of the second supporting layer 293 disposed away from the substrate 110.

Precisely speaking, the supporting structure 490 includes the first supporting layer 491 and the second supporting layer 293 stacked from bottom to top, with the first supporting layer 491 and the second supporting layer 293 being disposed at least one side of each bottom electrode layer 230 230a, for supporting the capacitor structure 260. In the present embodiment, the thickness of the first supporting layer 491 is for example the same as that of the second supporting layer 293, so that, the first segments 231a (having the first thickness T2) the portions 231 may be extended from the top surface of the connecting pads 180 to beyond the bottom surface of the first supporting layer 491, as shown in FIG. 11, but not limited thereto.

Overall speaking, at least one side of the portions of a part of the bottom electrode layers is thinned to reduce the thickness thereof, through a thinned process which is performed while removing the upper-half oxide layers of the supporting layer structure in the present disclosure. Then, the part of the bottom electrode layers may therefore present in a thin-top and thick-bottom structure, thereby achieving the purpose on enlarging the capacitor openings. Through these arrangements, the present disclosure is allowable to effectively improve the structural reliability of the storage node, as well as the functions and the performance thereof, while the density of the memory cells within the semiconductor device is continuously increased, and the fabricating process of the semiconductor device has been simplified.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor memory device, comprising:
a substrate;
a connecting pad, disposed on the substrate;
a supporting structure, disposed on the substrate and comprising a first supporting layer and a second supporting layer from bottom to top; and
a capacitor structure, disposed on the connecting pad and comprising a plurality of bottom electrode layers, wherein each of the bottom electrode layers comprises a first portion and a second portion extended upwardly, the first portion directly contacts the supporting structure, the second portion does not contact the supporting structure, and a top surface of the first portion is higher than a top surface of the second portion, wherein the first portion has a first thickness between the connecting pad and the first supporting layer, the second portion has the first thickness between the connecting pad and the first supporting layer, the first portion has a second thickness between the first supporting layer and the second supporting layer, the second portion has the second thickness between the first supporting layer and the second supporting layer, and the first thickness is greater than the second thickness;
wherein the first portion where directly contact the supporting structure further has a third thickness, the second portion where is higher than a bottom surface of the second supporting layer further has the second thickness, and the third thickness is greater than the second thickness.

2. The semiconductor memory device according to claim 1, wherein the second thickness is between the first supporting layer and the bottom surface of the second supporting layer.

3. The semiconductor memory device according to claim 2, wherein the first portion where has the third thickness is between the bottom surface of the second supporting layer and a top surface of the second supporting layer.

4. The semiconductor memory device according to claim 3, wherein the third thickness is the same as the first thickness.

5. The semiconductor memory device according to claim 3, wherein the third thickness is greater than the first thickness.

6. The semiconductor memory device according to claim 3, wherein the two portions have different heights in a direction which is perpendicular to the substrate.

7. The semiconductor memory device according to claim 1, wherein the second thickness is extended beyond the bottom surface of the second supporting layer.

8. The semiconductor memory device according to claim 1, wherein the first thickness is extended to a top surface of the first supporting layer.

9. The semiconductor memory device according to claim 1, wherein the first thickness is extended beyond a bottom surface of the first supporting layer.

10. The semiconductor memory device according to claim 1, wherein the first portion and the second portion are asymmetric with each other.

* * * * *